United States Patent [19]

Armstrong

[11] Patent Number: 4,920,321
[45] Date of Patent: Apr. 24, 1990

[54] AMPLIFIER CIRCUIT ARRANGEMENT

[75] Inventor: Desmond R. Armstrong, Wallington, England

[73] Assignee: U.S. Philips Corporation, New York, N.Y.

[21] Appl. No.: 289,650

[22] Filed: Dec. 22, 1988

[30] Foreign Application Priority Data

Dec. 24, 1987 [GB] United Kingdom ............... 8730137

[51] Int. Cl.$^5$ .............................................. H03F 3/45
[52] U.S. Cl. ..................................... 330/257; 330/311
[58] Field of Search ............... 330/252, 255, 257, 288, 330/311; 323/315, 316

[56] References Cited

U.S. PATENT DOCUMENTS 4,600,893 7/1986 Sugimoto ..................... 330/257 X
4,710,728 12/1987 Davis ................................. 330/252
4,839,609 6/1989 Hara et al. ..................... 330/257 X Primary Examiner—Steven Mottola
Attorney, Agent, or Firm—Bernard Franzblau

[57] ABSTRACT

An amplifier circuit wherein the output signal of an npn long-tailed transistor pair amplifier stage (1) is referenced to a first power supply point (5). In order to transfer this signal to the input of a second npn stage without using pnp transistors and without noise on the first supply point becoming superimposed on the signal, an intermediate stage (2) is provided. The intermediate stage comprises a current mirror (10) to the input and output of which are coupled the respective collectors of the pair transistors (3,4) via respective emitter followers (13,15) and respective resistors (14,16). The values of these resistors, the load resistors (6,7) of the pair transistors, and the current gains of the emitter followers and the current mirror are chosen such that any change in the potential on the output (17) of the intermediate stage (2) relative to a second power supply point (8), which would otherwise result from a change in the potential on the first supply point (5) relative to that on the second supply point, is compensated for by a change in the mirror output current, thus producing changes in the currents through two of the resistors (7,16).

8 Claims, 1 Drawing Sheet

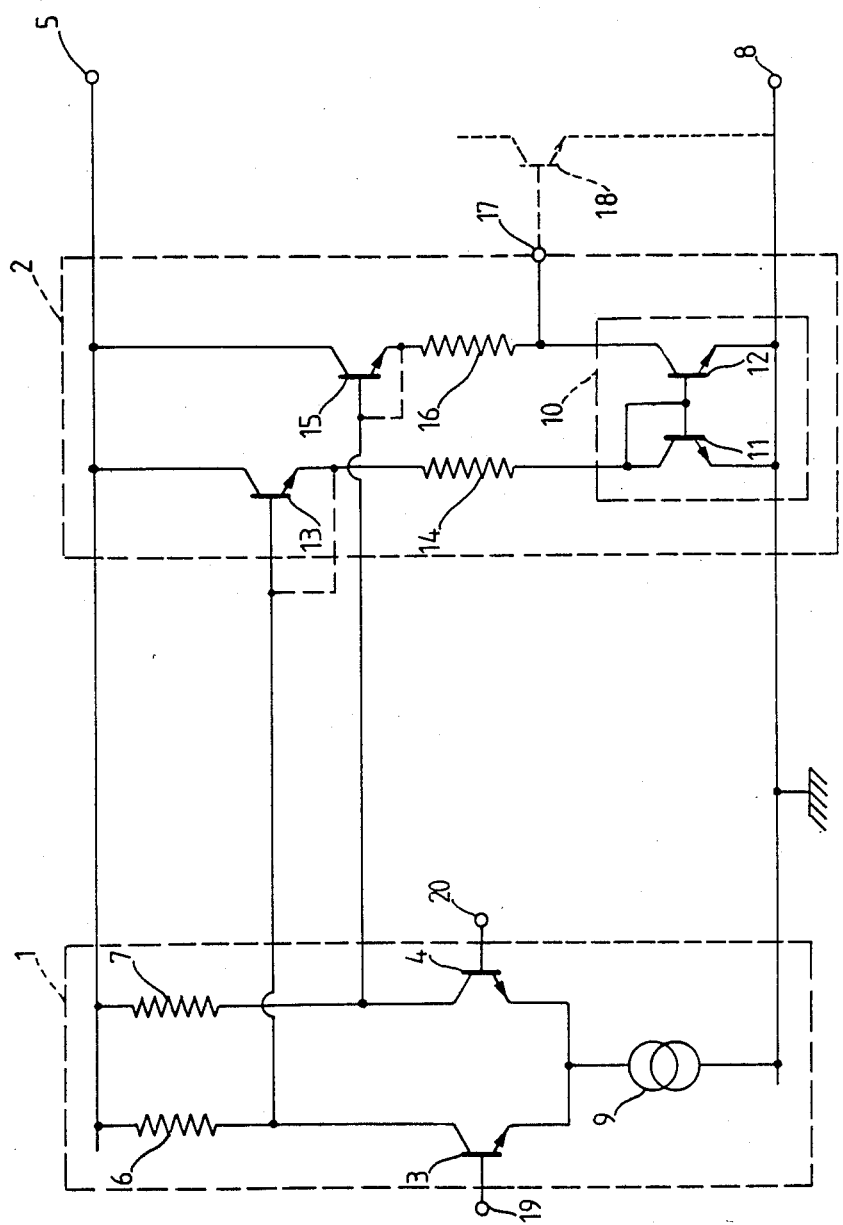

AMPLIFIER CIRCUIT ARRANGEMENT

BACKGROUND OF THE INVENTION

This invention relates to an amplifier circuit arrangement having first and second stages in cascade, the first stage comprising a long tail pair of first and second transistors of the same conductivity type and first and second resistors coupling output electrodes of said first and second transistors respectively to a first voltage reference point. The second stage comprises a current amplifier circuit and a third resistor, the output electrode end of said first resistor being coupled to a second voltage reference point via said third resistor and the input current path of said current amplifier circuit in that order, and the output electrode end of said second resistor being coupled to said second voltage reference point via the output current path of said current amplifier circuit.

Long tail pairs of transistors are often employed in amplifier circuit arrangements, particularly when the arrangements are in integrated circuit form. Individual integrated circuit manufacturing techniques tend to favour the fabrication of transistors of a particular conductivity type rather than transistors of the opposite conductivity type, for example, because those of the particular conductivity type take the form of so-called "vertical" transistor structures whereas those of the opposite conductivity type take the form of so-called "lateral" transistors. "Vertical" transistor structures tend to have higher gains and cut-off frequencies than "lateral" transistor structures, with the result that in many applications it is usual to try to avoid employing "lateral" transistors if at all possible. However, sometimes other considerations come into play which militate against this. One of these is a requirement in some applications that noise superimposed on the supply voltage of the arrangement must not, or must only negligibly, become manifest in the output signal of the arrangement. An amplifier arrangement of the general kind specified in the first paragraph is known from U.S. Pat. No. 4,710,728. In this known amplifier the (differential) output of the first stage is constituted by the output electrode ends of the first and second resistors. Signal voltages occurring at these points are, of course, relative to the first voltage reference point because they are set up across the first and second resistors respectively. Thus, if a said signal voltage were applied to the control electrode of a third transistor the common electrode of which is connected to the first voltage reference point, any noise occurring at the first voltage reference point will not have any effect on the signal occurring between said control and common electrodes. However, this would mean in practice that, unless the provision, for example, of more than two supply potentials could be tolerated, the third transistor would have to be of the opposite conductivity type to said same conductivity type, which as stated above is often unsatisfactory. It is an object of the invention to enable this problem to be mitigated.

SUMMARY OF THE INVENTION

According to the invention, an amplifier circuit arrangement as defined in the first paragraph is characterised in that a fourth resistor is included in series between the output electrode end of the second resistor and the output current path of the current amplifier circuit, in that the output current path end of said fourth resistor constitutes an output of the second stage, and in that the resistance values of said first, second, third and fourth resistors, and the gain of said current amplifier, are chosen such that in operation the voltage at the output of the second stage is substantially independent of variations in the potential on the first voltage reference point relative to the potential on the second voltage reference point.

It has now been recognised that if the second stage has a circuit configuration as set forth, then with a suitable choice of the values of the resistors and the gain of the current amplifier, the output signal of the first stage can be coupled to the output of the second stage in a manner such that any noise occurring at the first voltage reference point relative to the second voltage reference point will have little or no effect on the signal occurring at the output of the second stage, relative to the second voltage reference point. If the sign of the voltage between the first and second voltage reference points is appropriately chosen the signal at the output of the second stage (which stage may itself include transistors all of which are of said same conductivity type) can be applied in turn, for example, to the control electrode of a further transistor of said same conductivity type the common electrode of which is connected to the second voltage reference point (to which the "tail" of the long tail pair may conveniently be connected).

The terms "control electrode", "output electrode" and "common electrode" are to be understood to mean herein "base electrode", "collector electrode" and "emitter electrode" respectively if the relevant transistor is a bipolar transistor, and to mean "gate electrode", "drain electrode" and "source electrode" respectively if the relevant transistor is a field-effect transistor. The gain G of the current amplifier stage may, or course, be less than, equal to, or greater than unity.

The second stage may include third and fourth transistors of said same conductivity type, the output electrodes of said third and fourth transistors being connected to said first voltage reference point, and the control electrode/common electrode paths of said third and fourth transistors being included between said output electrode end of said first resistor and said third resistor, and between said output electrode end of said second resistor and said fourth resistor, respectively. On the other hand if the values of the third and fourth resistors are high relative to the values of the first and second resistors, respectively, the third and fourth resistors may be connected directly to the first and second resistors, respectively.

BRIEF DESCRIPTION OF THE DRAWING

Embodiments of the invention will now be described, by way of example, with reference to the accompanying diagrammatic drawing the single FIGURE of which is a circuit diagram of a particular embodiment.

DESCRIPTION OF THE PREFERRED EMBODIMENTS

In the drawing an amplifier circuit arrangement comprises first and second stages 1 and 2 in cascade. The first stage 1 comprises a long tail pair of npn transistors 3 and 4 the collector electrodes of which are connected to a first voltage reference point 5 via first and second resistors 6 and 7 respectively. The commoned emitters of the transistors 3 and 4 are connected to a second voltage reference point 8 via a current source 9. The second stage 2 comprises a current amplifier circuit 10 which takes the form of a so-called current mirror circuit. Circuit 10 comprises a pair of npn transistors 11 and 12 the emitters of which are commoned and connected to the point 8. The bases of these transistors are also commoned and connected to the collector of transistor 11. The input current path of circuit 10 extends from the collector/base of transistor 11 to point 8, and the output current path thereof extends from the collector of transistor 12 to point 8. The collector end of resistor 6 is connected to the collector/base of transistor 11 via the base-emitter path of npn transistor 13 and a third resistor 14, in that order, and the collector end of resistor 7 is connected to the collector of transistor 12 via the base-emitter path of a transistor 15 and a fourth resistor 16, in that order. The collectors of transistors 13 and 15 are connected to point 5. The common point of resistor 16 and the collector of transistor 12 constitutes the output 17 of the stage 2, and may be connected to the base of a further npn transistor 18 if desired, as indicated in dashed lines. The resistance values $R_6$, $R_7$, $R_{14}$ and $R_{16}$ of the resistors 6, 7, 14 and 16 respectively, together with the current gain G of amplifier 10, are chosen in relation to the current gains $B_{13}$ and $B_{15}$ of transistors 13 and 15, respectively, such that the equation $$R_7G(1+B_{13})/(1+B_{15})+R_{16}G(1+B_{13})=R_6+R_{14}(1+B_{13})$$

is substantially satisfied. The reason for this will become apparent below.

In operation a positive supply potential is applied to point 5' relative to point 8 and an input signal is applied between the bases of transistors 3 and 4 (points 19 and 20 respectively). The resulting differential signal voltages appearing at the collectors of the transistors 3 and 4 are applied to the input current path of amplifier 10 via emitter follower transmitter 13 and resistor 14, and to the common point of the output current path of amplifier 10 and output terminal 17 via emitter follower transistor 15 and resistor 16, respectively. The resulting signal current flowing in the input path of amplifier 10 results in known manner in G times this signal current flowing in the output path of amplifier 10. The overall result is that the output signal of stage 1 is successfully coupled to the output 17 of stage 2.

If the potential at point 5 should vary relative to that on point 8, the base current of transistor 13 will vary by i, say. This will result in a change of $i(1+B_{13})$ in the emitter current of transistor 13 and hence in the currents through resistor 14 and the input current path of amplifier 10. The result is therefore a change of $Gi(1+B_{13})$ in the output current of amplifier 10 and hence in the emitter current of transistor 15 and the current through resistor 16. The resulting change in the base current of transistor 15 is therefore $Gi(1+B_{13})/(1+B_{15})$. The change in the potential at output terminal 17 relative to point 5 is therefore $R_7Gi(1+B_{13})/(1+B_{15})+R_{16}Gi(1+B_{13})$. However the change v in the potential on point 5 relative to that on point 8 is given by $v=R_6i+R_{14}i(1+B_{13})$. As has been mentioned previously, $R_6$, $R_7$, $R_{14}$, $R_{16}$ and G have been chosen relative to $B_{13}$ and $B_{15}$ such that the equation $$R_7G(1+B_{13})/(1+B_{15})+R_{16}G(1+B_{13})=R_6+R_{14}(1+B_{13})$$

is substantially satisfied; an error of, for example, 5% may occur in practice due, for example, to unavoidable tolerances in circuit elements manufactured by integrated circuit techniques. Thus, the change in the potential at output terminal 17 relative to point 5 is itself substantially equal to v. In other words, the change in the potential at output terminal 17 relative to point 8 is substantially zero, as required.

The emitter follower transistors 13 and 15, which in effect constitute signal voltage sources of internal resistances $R_6/(1+B_{13})$ and $R_7/(1+B_{15})$ respectively connected between the ends of the resistors 14 and 16 and the point 5, are provided basically to reduce the load imposed on the output of stage 1 by the input of stage 2. If the values of resistors 14 and 16 are high relative to the values of resistors 6 and 7, respectively, these emitter followers may be omitted, resistor 14 then being connected directly to the collector end of resistor 6 (as shown by the dashed line) and resistor 16 being connected directly to the collector end of resistor 7 (as shown by the dashed line) so that the resistors 6 and 7 now themselves effectively constitute signal voltage sources of internal resistances $R_6$ and $R_7$ respectively connected between the ends of the resistors 14 and 16 and the point 5 when driven by the long trail pair transistors. If this is done the result is equivalent to writing $B_{13}=B_{15}=0$ in the expression quoted above, which in consequence reduces to $$G(R_7+R_{16})=R_6+R_{14}.$$

If desired, respective capacitors, possibly in series with respective resistors, may be provided across each of the resistors 14 and 16 to improve the frequency response of the arrangement. If such are provided the ratio between their imedances should be chosen equal to the ratio between the corresponding resistors 14 and 16.

Obviously the npn transistors in the circuits described may be replaced by pnp transistors if the polarity of the supply voltage applied between points 5 and 8 is reversed. Altenatively, they may be replaced by n-channel (or p-channel if the polarity of the supply voltage is reversed) field effect transistors, the gates, drains and sources of the latter corresponding to the bases, collectors and emitters respectively of the bipolar transistors described. The simple current mirror construction shown for the amplifier 10 may of course be replaced by another form of current amplifier circuit, for example, one of the many other current mirror circuits which are well-known to persons skilled in the art.

From reading the present disclosure, other modifications will be apparent to persons skilled in the art. Such modifications may involve other features which are already known in the design, manufacture and use of circuit arrangements and component parts thereof and which may be used instead of or in addition to features already described herein. Although claims have been presented to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

I claim:

1. An amplifier circuit arrangement comprising: first and second stages in cascade, the first stage comprising a long tail pair of first and second transistors of the same conductivity type and first and second resistors coupling output electrodes of said first and second transistors, respectively, to a first voltage reference point and the second stage comprising a current amplifier circuit and a third resistor, the output electrode end of said first resistor being coupled to a second voltage reference point via said third resistor and the input current path of said current amplifier circuit in that order, and the output electrode end of said second resistor being coupled to said second voltage reference point via a fourth resistor in series with the output current path of said current amplifier circuit, wherein the output current path end of said fourth resistor constitutes an output of the second stage, and wherein the resistance values of said first, second, third and fourth resistors, and the gain of said current amplifier, are chosen such that in operation the voltage at the output of the second stage is substantially independent of variations in the potential on the first voltage reference point relative to the potential on the second voltage reference point.

2. An arrangement as claimed in claim 1, wherein the second stage includes transistors all of which are of said same conductivity type.

3. An arrangement as claimed in claim 1, wherein the second stage includes third and fourth transistors of said same conductivity type, the output electrodes of said third and fourth transistors being connected to said first voltage reference point, and the control electrode/common electrode paths of said third and fourth transistors being included between said output electrode end of said first resistor and said third resistor, and between said output electrode end of said second resistor and said fourth resistor, respectively.

4. An arrangement as claimed in claim 1, wherein the resistance values of said third and fourth resistors are high relative to the resistance values of said first and second resistors, respectively, and the third and fourth resistors, are connected directly to the first and second resistors respectively.

5. An arrangement as claimed in claim 3, wherein the tail of the long tail pair is connected to the second voltage reference point.

6. An arrangement as claimed in claim 2, wherein the resistance values of said third and fourth resistors are high relative to the resistance values of said first and second resistors, respectively, and the third and fourth resistors are connected directly to the first and second resistors, respectively.

7. An arrangement as claimed in claim 1, wherein the tail of the long tail pair is connected to the second voltage reference point.

8. An arrangement as claimed in claim 2, wherein the tail of the long tail pair is connected to the second voltage reference point.

* * * * *